United States Patent
Imamura

(10) Patent No.: US 12,218,394 B2
(45) Date of Patent: Feb. 4, 2025

(54) POWER FEED CIRCUIT COMPRISING A SYNTHESIZING-DISTRIBUTING UNIT AND A PHASE SHIFTING UNIT CONFIGURED FOR FEEDING A TWO POINT OR A FOUR POINT CIRCULARLY POLARIZED ANTENNA

(71) Applicant: HARADA INDUSTRY CO., LTD., Tokyo (JP)

(72) Inventor: Yutaka Imamura, Tokyo (JP)

(73) Assignee: HARADA INDUSTRY CO., LTD., Tokyo (JP)

( * ) Notice: Subject to any disclaimer, the term of this patent is extended or adjusted under 35 U.S.C. 154(b) by 213 days.

(21) Appl. No.: 17/790,485

(22) PCT Filed: Nov. 9, 2020

(86) PCT No.: PCT/JP2020/041784
§ 371 (c)(1),
(2) Date: Jun. 30, 2022

(87) PCT Pub. No.: WO2021/140738
PCT Pub. Date: Jul. 15, 2021

(65) Prior Publication Data
US 2023/0044376 A1 Feb. 9, 2023

(30) Foreign Application Priority Data
Jan. 6, 2020 (JP) .................. 2020-000527

(51) Int. Cl.
*H01P 1/17* (2006.01)
*H01P 5/16* (2006.01)
(Continued)

(52) U.S. Cl.
CPC .................. *H01P 1/17* (2013.01); *H01P 5/16* (2013.01); *H01Q 9/0428* (2013.01);
(Continued)

(58) Field of Classification Search
CPC ........... H01P 1/165; H01P 1/17; H03H 7/482; H03H 7/185; H01Q 15/244
(Continued)

(56) References Cited

U.S. PATENT DOCUMENTS 5,010,348 A * 4/1991 Rene et al. .......... H01Q 9/0414
343/789
5,043,683 A * 8/1991 Howard .................... H01P 1/17
343/756
(Continued)

FOREIGN PATENT DOCUMENTS

JP H06169219 A 6/1994
JP H11127004 A 5/1999
(Continued)

OTHER PUBLICATIONS

Harvinder Singh Nagi; Miniature lumped element 180° Wilkinson Divider; IEEE Mtt-S International Microwave Symposium Digest, 2003; vol. I; pp. 55-58 (IEEE Xplore); 2003) I Introduction; II Theoreticanl Analysis; III Design Methodology and Practical Implementation, entire text, all drawings.
(Continued)

*Primary Examiner* — Benny T Lee
(74) *Attorney, Agent, or Firm* — Global IP Counselors, LLP

(57) ABSTRACT

A power feed circuit for a circularly polarized antenna includes a synthesizing-distributing unit and a phase shift unit. The synthesizing-distributing unit distributes input signals to two paths with the same phase and same amplitude. The phase shift unit has two phase shift circuits connected respectively between the two paths distributed by the synthesizing-distributing unit and two feed points of a circularly polarized antenna. The phase shift unit outputs (Continued)

signals whose phase difference is 90° to the two feed points and of the circularly polarized antenna.

10 Claims, 4 Drawing Sheets

(51) Int. Cl.
    *H01Q 9/04*     (2006.01)
    *H01Q 15/24*     (2006.01)
    *H03F 3/60*     (2006.01)
    *H03H 7/18*     (2006.01)
    *H03H 7/48*     (2006.01)
    *H04B 1/18*     (2006.01)

(52) U.S. Cl.
    CPC ............. *H01Q 15/244* (2013.01); *H03F 3/60* (2013.01); *H03H 7/185* (2013.01); *H03H 7/48* (2013.01); *H04B 1/18* (2013.01)

(58) Field of Classification Search
    USPC ........................................................ 333/21 A
    See application file for complete search history.

(56) References Cited

U.S. PATENT DOCUMENTS

| | | | |
|---|---|---|---|
| 5,276,410 A * | 1/1994 | Fukuzawa et al. | ........................ H01Q 13/0241 333/254 |
| 2004/0012527 A1 | 1/2004 | Yuanzhu | |
| 2015/0035604 A1 | 2/2015 | Holmes et al. | |
| 2016/0211581 A1 | 7/2016 | Sampo et al. | |
| 2018/0233798 A1 | 8/2018 | Moriguchi | |
| 2020/0059005 A1* | 2/2020 | Wu et al. | ............. H01Q 9/0435 |

FOREIGN PATENT DOCUMENTS

| | | |
|---|---|---|
| JP | 2004056204 A | 2/2004 |
| JP | 2008017159 A | 1/2008 |
| JP | 2015019132 A | 1/2015 |
| WO | 2017026107 A1 | 2/2017 |

OTHER PUBLICATIONS

International Search REPORT(PCT/JP2020/041784) dated Feb. 2, 2021.

* cited by examiner

POWER FEED CIRCUIT COMPRISING A SYNTHESIZING-DISTRIBUTING UNIT AND A PHASE SHIFTING UNIT CONFIGURED FOR FEEDING A TWO POINT OR A FOUR POINT CIRCULARLY POLARIZED ANTENNA

CROSS-REFERENCE TO RELATED APPLICATIONS

This application is a U.S. national stage application of International Application No. PCT/JP2020/041784, filed on Nov. 9, 2020. The present application claims priority based on Japanese Patent Application No. 2020-000527, filed on Jan. 6, 2020, and the entire contents thereof are hereby incorporated herein by reference.

TECHNICAL FIELD

The present invention relates to a power feed circuit for a circularly polarized antenna and, more particularly, to a power feed circuit for a circularly polarized antenna suitable for a two-point-feed patch antenna.

BACKGROUND INFORMATION

In general, a circularly polarized antenna, specifically, a patch antenna supporting a circularly polarized wave has been widely used for such as a GNSS (Global Navigation Satellite System) antenna. As the circularly polarized antenna, there is known a patch antenna having a configuration in which a ceramic, a dielectric substrate, or the like is interposed between a radiating element and a ground conductor. The circularly polarized antenna includes a one-point-feed type and a two-point-feed type.

Circularly polarized antennas of the two-point-feed type become possible to support a circularly polarized wave by feeding power such that a phase difference between signals to be fed to the respective two points is 90°. A power feed circuit exhibiting such a phase difference is disclosed in, for example, Japanese Patent Application Kokai Publication No. 2015-019132 A (hereinafter Patent Document 1). In the power feed circuit disclosed in Patent Document 1, a Wilkinson circuit is connected to an input terminal, a phase shift unit using a 90° phase lag circuit is connected to one of two output terminals that output two distributed signals, and two paths with a 90° phase difference are connected to two feed points.

SUMMARY OF THE INVENTION

However, the power feed circuit disclosed in Patent Document 1 is configured to be connected to two feed points with the phase shift unit connected to only one of two paths to the respective two output terminals, so that a signal on the path connected to the phase shift unit is slightly attenuated in amplitude as compared to a signal on the path not connected to the phase shift circuit. The phase shift circuit is a circuit configured so as to be able to obtain a phase difference of 90° in a specific frequency band and to minimize amplitude attenuation. A frequency band of the power feed circuit in which the 90° phase difference can be obtained and that in which amplitude attenuation can be suppressed are each relatively narrow. Specifically, a frequency band in the range from 1559 MHz to 1610 MHz (Upper-L Band) of the entire frequency band used in a GNSS antenna allows a practicable phase difference and amplitude ratio to be obtained.

GNSS antennas have recently been required to cover the GNSS full band including a frequency band in the range from 1164 MHz to 1300 MHZ (Lower-L Band) in addition to the above-mentioned frequency band in the range from 1559 MHz to 1610 MHz (Upper-L Band). However, it is difficult for the power feed circuit disclosed in Patent Document 1 to obtain a practicable phase shift and to suppress amplitude attenuation in the frequency band in the range from 1164 MHz to 1300 MHZ. Thus, in the power feed circuit disclosed in Patent Document 1, in a wide band from Lower-L Band to Upper-L Band, a phase difference between two output terminals deviates from 90°, and axial ratio characteristics as an index of circular polarization characteristics deteriorate as the amplitude ratio becomes larger.

In view of the above situations, an object of the present invention is to provide a power feed circuit for a circularly polarized antenna achieving a stable phase difference and a small amplitude ratio between two paths for feeding power to two feed points of a circularly polarized antenna over a wide band.

To attain the above object of the present invention, a power feed circuit for a circularly polarized antenna may include: a synthesizing-distributing unit that distributes input signals to two paths with the same phase and same amplitude; and a phase shift unit that has two phase shift circuits connected respectively between the two paths distributed by the synthesizing-distributing unit and two feed points of the circularly polarized antenna and that outputs signals whose phase difference is 90° to the two feed points of the circularly polarized antenna.

The phase shift unit may be constituted by one of the phase shift circuits being a phase lag circuit, and the other thereof being a phase lead circuit.

Further, the phase shift unit may be constituted by one of the phase shift circuits shifting the phase of a signal by −45°, and the other thereof shifting the phase of a signal by +45°.

Further, the phase shift unit may be constituted by one of the phase shift circuits having a low-pass filter circuit configuration, and the other thereof having a high-pass filter circuit configuration.

Further, one of the phase shift circuits of the phase shift unit may be an L-type CL filter circuit, a π-type CLC filter circuit, a T-type LCL filter circuit, or a multistage circuit thereof, and the other of the phase shift circuits may be an L-type LC filter circuit, a π-type LCL circuit, a T-type CLC filter circuit, or a multistage circuit thereof.

Further, the phase shift unit may be constituted by a lumped constant circuit.

Further, the synthesizing-distributing unit may be constituted by a lumped constant circuit or a Wilkinson circuit provided by a distributed constant circuit.

A power feed circuit for a four-point-feed circularly polarized antenna may include: a first power feed circuit including a first synthesizing-distributing unit that distributes signals from a first input terminal to two paths with the same phase and same amplitude, and a first phase shift unit that has two first phase shift circuits connected respectively between the two paths distributed by the first synthesizing-distributing unit and two feed points in the four feed points of the circularly polarized antenna and that outputs signals whose phase difference is 90° to the two feed points in the four feed points of the circularly polarized antenna; a second power feed circuit including a second synthesizing-distributing unit that distributes signals from a second input terminal to two paths with the same phase and same amplitude, and a second phase shift unit that has two second phase shift circuits connected respectively between the two paths distributed by the second synthesizing-distributing unit and the remaining two feed points in the four feed points of the circularly polarized antenna and that outputs signals whose phase difference is 90° to the remaining two feed points in the four feed points of the circularly polarized antenna; and a 180° synthesizing-distributing unit that distributes input signals to two paths such that a phase difference between the signals is 180°, the two paths distributed by the 180° synthesizing-distributing unit being connected respectively to the first input terminal and the second input terminal and outputting the signals whose phase difference is 180° to the first input terminal and the second input terminal.

In the above invention, the 180° synthesizing-distributing unit may include: a third synthesizing-distributing unit that distributes input signals to two paths with the same phase and same amplitude; and a third phase shift unit that has two third phase shift circuits connected respectively between the two paths distributed by the third synthesizing-distributing unit and first and second input terminals.

Further, the 180° synthesizing-distributing unit may be constituted by a 180° rat-race circuit.

Further, the 180° synthesizing-distributing unit may be constituted by: a 90° hybrid circuit that distributes input signals to two paths such that a phase difference between the signals is 90°; and a 90° phase shift circuit connected to one of the two paths distributed by the 90° hybrid circuit, wherein a path from the 90° phase shift circuit is connected to the first input terminal, and the other of the two paths distributed by the 90° hybrid circuit is connected to the second input terminal.

The power feed circuit for a circularly polarized antenna according to the present invention can achieve a stable phase difference and a small amplitude ratio between two paths for feeding power to two feed points of a circularly polarized antenna over a wide band.

DETAILED DESCRIPTION OF THE EMBODIMENTS

Figure 1:
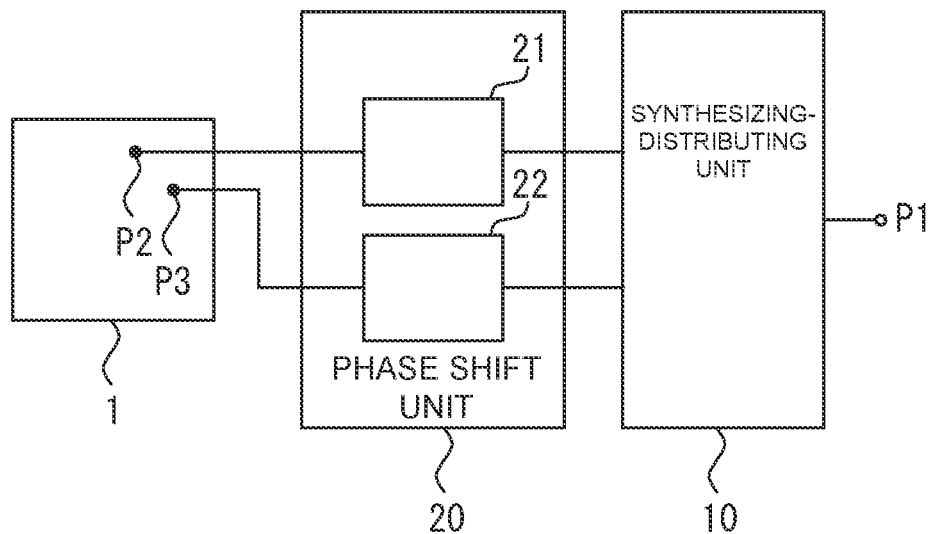
FIG. 1 is a schematic block diagram for explaining a power feed circuit for a circularly polarized antenna according to the present invention.

Hereinafter, P an embodiment for practicing the present invention will be described with illustrated examples. FIG. 1 is a schematic block diagram for explaining a power feed circuit for a circularly polarized antenna according to the present invention. The power feed circuit for a circularly polarized antenna according to the present invention is a power feed circuit for feeding power to a circularly polarized antenna 1. The illustrated circularly polarized antenna 1 may be a two-point-feed patch antenna supplied with power from two feed points P2 and P3. As illustrated, the power feed circuit for a circularly polarized antenna according to the present invention includes a synthesizing-distributing unit 10 and a phase shift unit 20.

The synthesizing-distributing unit 10 distributes input signals from a port P1 with the same phase and same amplitude to two paths. The two distributed paths are connected to the phase shift unit 20, the details of which will be described later. The synthesizing-distributing unit 10 may be constituted by a lumped constant circuit or a distributed constant circuit. The lumped constant circuit is a circuit using a discrete component such as a capacitor or a coil formed of a chip component or a lead component. The distributed constant circuit is a circuit constituted by a transmission line or a circuit in which, for example, a coil or a capacitor is patterned on a circuit board.

The phase shift unit 20 has two phase shift circuits 21 and 22. The two phase shift circuits 21 and 22 are connected respectively between the two paths distributed by the synthesizing-distributing unit 10 and two feed points P2, P3 of the circularly polarized antenna 1. That is, the phase shift circuits 21 and 22 are interposed respectively on the paths to the two feed points P2 and P3. The phase shift circuits 21 and 22 are each constituted by, for example, a lumped constant circuit. That is, the phase shift circuits 21 and 22 may each use a discrete component such as a capacitor or a coil formed of a chip component or a lead component. The phase shift unit 20 outputs signals whose phase difference is 90° to the two feed points P2 and P3 of the circularly polarized antenna 1. For example, the phase shift circuit 21 may be a phase lag circuit, and the phase shift circuit 22 may be a phase lead circuit. For example, when the phase shift circuit 21 is a circuit (phase lag circuit) that shifts a phase by −45°, the phase shift circuit 22 is a circuit (phase lead circuit) that shifts a phase by +45°. Thus, a phase difference between the two phase shift circuits 21 and 22 may be 90°. When the phase shift unit 20 is constituted by only a phase lag circuit, it can be constituted by a $\lambda/4$ transmission line or the like. In the illustrated power feed circuit for a circularly polarized antenna, the phase shift unit 20 uses not only a phase lag circuit but also a phase lead circuit and is constituted by a lumped constant circuit. Alternatively, the phase shift unit 20 may be constituted by a distributed constant circuit having a patterned coil or a patterned capacitor. When the phase shift unit 20 is constituted by a distributed constant circuit using a transmission line, both the phase shift circuits 21 and 22 may be constituted by a phase lag circuit and have a phase difference of 90° therebetween. For example, the phase shift circuit 21 may be constituted by a circuit (phase lag circuit) that shifts a phase by −45°, and the phase shift circuit 22 may be constituted by a circuit (phase lag circuit) that shifts a phase by −135°.

Figure 2:
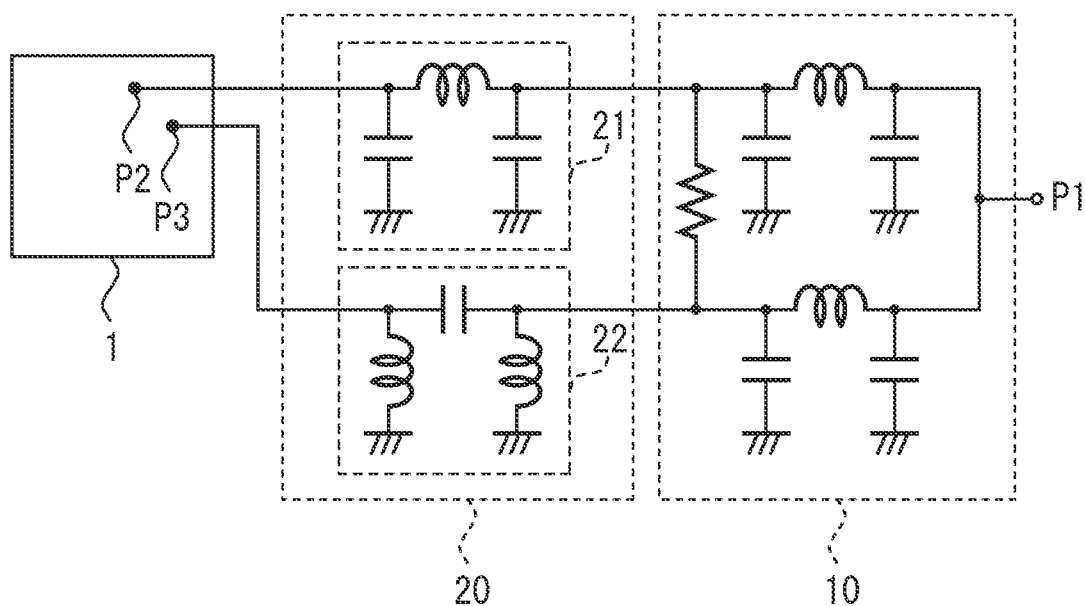
FIG. 2 is a specific circuit diagram for explaining the power feed circuit for a circularly polarized antenna according to the present invention.

FIG. 2 is a specific circuit diagram for explaining the power feed circuit for a circularly polarized antenna according to the present invention. In the drawing, the same reference numerals as those in FIG. 1 denote the same parts. As illustrated, the synthesizing-distributing unit 10 of the power feed circuit for a circularly polarized antenna according to the present invention is constituted by a lumped constant Wilkinson circuit. The illustrated Wilkinson circuit includes two π-type filter circuits in which two paths connected respectively to the phase shift circuits 21 and 22 of the phase shift unit 20 are connected through a resistance. Specifically, the illustrated T-type filter circuits are each a π-type CLC low-pass filter circuit, in which a coil is connected in series to the path between the port P1 of the synthesizing-distributing unit 10 and the phase shift unit 20, and two grounded capacitors are connected to both ends of the coil. The parallel-connected π-type filter circuits of the synthesizing-distributing unit 10 as the Wilkinson circuit are each not limited to the illustrated example and may each have a low-pass filter configuration or a high-pass filter configuration as long as it has a filter circuit configuration and may further be an L-type or T-type filter circuit, or a multistage circuit thereof. The center frequency of the filter circuits of the synthesizing-distributing unit 10 may be, for example, 1387 MHz which is the center frequency of the passband of the GNSS full band (1164 MHZ-1610 MHz).

Figure 3:
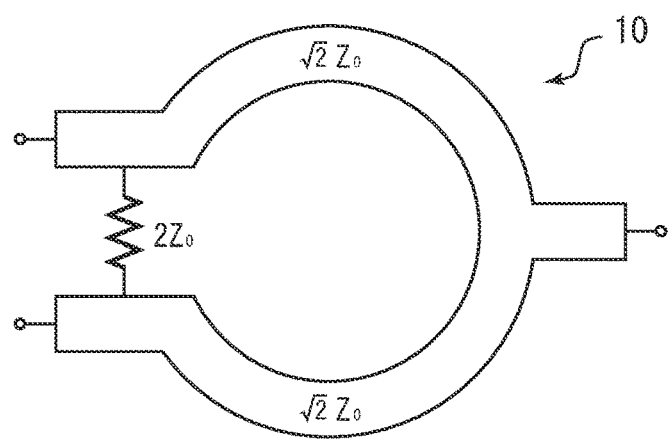
FIG. 3 is a schematic plan view for explaining an example where a synthesizing-distributing unit of the power feed circuit for a circularly polarized antenna according to the present invention is constituted by a distributed constant circuit.

Further, as described above, the synthesizing-distributing unit 10 may have a configuration capable of distributing input signals with the same phase and same amplitude to two paths and may be constituted by either a lumped constant circuit or a distributed constant circuit. FIG. 3 is a schematic plan view for explaining an example where the synthesizing-distributing unit of the power feed circuit for a circularly polarized antenna according to the present invention is constituted by a distributed constant circuit. The illustrated synthesizing-distributing unit 10 has a shape in which a signal is distributed by two λ/4 transmission lines each having a characteristic impedance of $\sqrt{2}Z_0$, and the two transmission lines distributed to the phase shift unit 20 are connected through a resistance of $2Z_0$. In the power feed circuit for a circularly polarized antenna according to the present invention, the synthesizing-distributing unit may be constituted by the thus configured distributed constant circuit.

Referring back to FIG. 2, the phase shift unit 20 of the power feed circuit for a circularly polarized antenna according to the present invention includes the phase shift circuit 21 with a low-pass filter circuit configuration and the phase shift circuit 22 with a high-pass filter circuit configuration. The illustrated phase shift circuit 21 is a π-type CLC filter circuit. Specifically, a coil is connected to the path between the synthesizing-distributing unit 10 and the feed point P2, and two grounded capacitors are connected to both ends of the coil. The phase shift circuit 22 is a π-type LCL filter circuit. Specifically, a capacitor is connected in series to the path between the synthesizing-distributing unit 10 and the feed point P3, and two grounded coils are connected to both ends of the capacitor.

Thus, the power feed circuit for a circularly polarized antenna according to the present invention is configured such that input signals from the port P1 are distributed with the same phase and same amplitude by the synthesizing-distributing unit 10 and input to the phase shift circuits 21 and 22 of the phase shift unit 20 and whose phases are shifted by −45° and +45°, respectively, so that signals whose phase difference is 90° are input to the two feed points P2 and P3.

Examples of other circuit configurations of the phase shift unit will be described using FIGS. 4A to 4H. FIGS. 4A to 4H are circuit diagrams for explaining other circuit configurations of the phase shift unit of the power feed circuit for a circularly polarized antenna according to the present invention. In the drawing, the same reference numerals as those in FIG. 1 denote the same parts. FIGS. 4A to 4D are modifications of the phase shift circuit 21, and FIGS. 4E to 4H are modifications of the phase shift circuit 22.

Figure 4A:
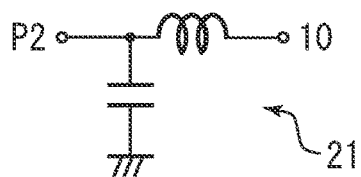
FIGS. 4A to 4H are circuit diagrams for explaining other circuit configurations of a phase shift unit of the power feed circuit for a circularly polarized antenna according to the present invention.

As illustrated in FIG. 4A, the phase shift circuit 21 may be an L-type LC filter circuit. Specifically, a coil is connected in series to the path between the synthesizing-distributing unit 10 and the feed point P2, and a grounded capacitor is connected to the feed point P2 side. As illustrated in FIG. 4E, the phase shift circuit 22 may be an L-type CL filter circuit. Specifically, a capacitor is connected in series to the path between the synthesizing-distributing unit 10 and the feed point P3, and a grounded coil is connected to the feed point P3 side.

Figure 4B:
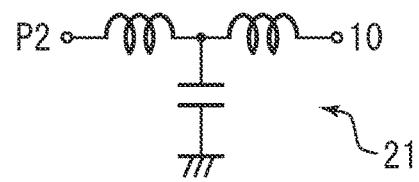

As illustrated in FIG. 4B, the phase shift circuit 21 may be a T-type LCL filter circuit. Specifically, two coils are connected in series to the path between the synthesizing-distributing unit 10 and the feed point P2, and a grounded capacitor is connected between the two coils. As illustrated in FIG. 4F, the phase shift circuit 22 may be a T-type CLC filter circuit. Specifically, two capacitors are connected in series to the path between the synthesizing-distributing unit 10 and the feed point P3, and a grounded coil is connected between the two capacitors.

Figure 4C:
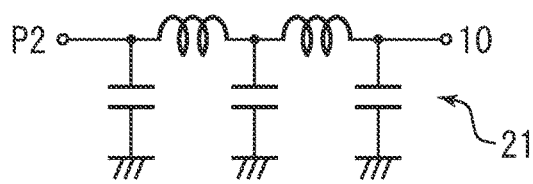

As illustrated in FIG. 4C, the phase shift circuit 21 may be a π-type CLC multistage circuit. Specifically, two coils are connected in series to the path between the synthesizing-distributing unit 10 and the feed point P2, and three grounded capacitors are connected between the two coils and to both ends of the series-connected coils. As illustrated in FIG. 4G, the phase shift circuit 22 may be a π-type LCL multistage circuit. Specifically, two capacitors are connected in series to the path between the synthesizing-distributing unit 10 and the feed point P3, and three grounded coils are connected between the two capacitors and to both ends of the series-connected capacitors.

Figure 4D:
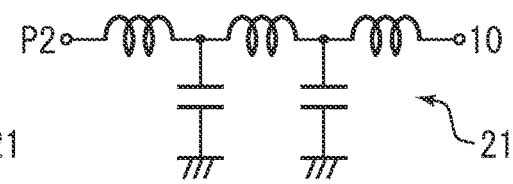
Figure 4E:
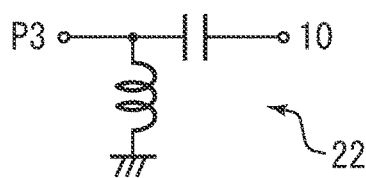
Figure 4F:
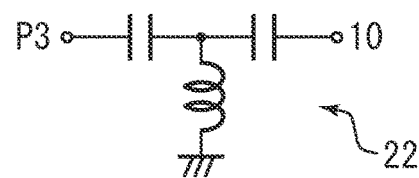
Figure 4G:
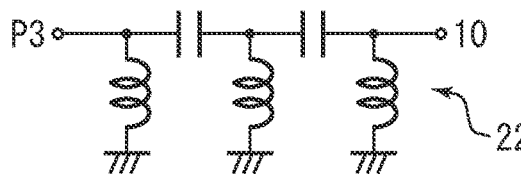
Figure 4H:
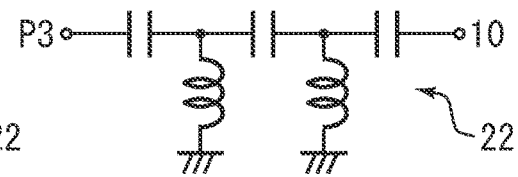

As illustrated in FIG. 4D, the phase shift circuit 21 may be a T-type LCL multistage circuit. Specifically, three coils are connected in series to the path between the synthesizing-distributing unit 10 and the feed point P2, and two grounded capacitors are connected between respective ones of the three coils. As illustrated in FIG. 4H, the phase shift circuit 22 may be a T-type CLC multistage circuit. Specifically, three capacitors are connected in series to the path between the synthesizing-distributing unit 10 and the feed point P3, and two grounded coils are connected between respective ones of the three capacitors.

As described above with respect to FIG. 2, the phase shift unit 20 of the power feed circuit for a circularly polarized antenna according to the present invention may include the phase shift circuit 21 with a low-pass filter circuit configuration and the phase shift circuit 22 with a high-pass filter circuit configuration. Further, as described with respect to FIGS. 4C, 4D, 4G, and 4H, employing the multistage circuit configuration allows for the achievement of a wider band. To make the two phase shift circuits 21 and 22 of the phase shift unit 20 stable over a wide band, the two phase shift circuits 21 and 22 preferably have the same configuration. That is, a combination of the circuit configurations illustrated in FIGS. 4A and 4E, a combination of the circuit configurations illustrated in FIGS. 4B and 4F, a combination of the circuit configurations illustrated in FIGS. 4C and 4G, and a combination of the circuit configurations illustrated in FIGS. 4D and 4H are preferably employed. This allows the two circuits corresponding to two paths to be routed in symmetric patterns and equalizes the stray capacitances of the two paths. Accordingly, deviation factors can be suppressed to stabilize a phase difference between the two paths over a wide band. Further, since the two circuits corresponding to the two paths have the same circuit configuration, the two circuits exhibit the same fluctuations with temperature change, and thus the power feed circuit for a circularly polarized antenna according to the present invention is resistant to temperature change. The center frequencies of the phase shift circuits 21 and 22 may be, for example, 1387 MHz which is the center frequency of the passband of the GNSS full band (1164 MHZ-1610 MHz).

Figure 5A:
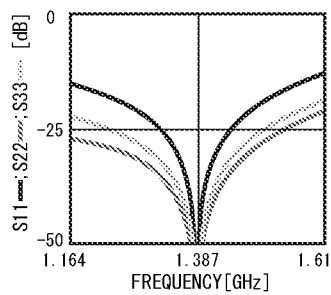
FIGS. 5A to 5C are graphs illustrating frequency characteristics of the power feed circuit for a circularly polarized antenna according to the present invention.
Figure 5B:
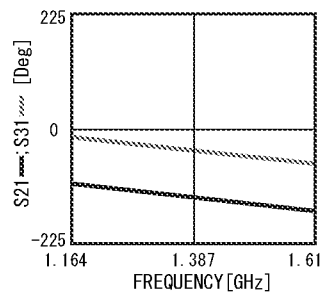
Figure 5C:
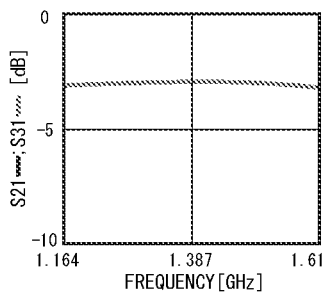
Figure 6A:
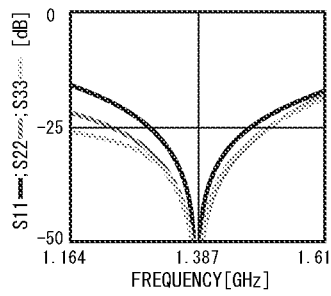
FIGS. 6A to 6C are graphs illustrating, as a comparative example, frequency characteristics of a conventional power feed circuit.
Figure 6B:
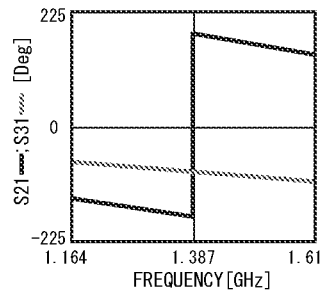
Figure 6C:
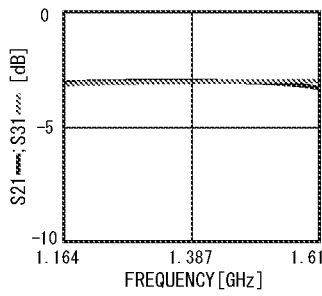

Next, the frequency characteristics of the power feed circuit for a circularly polarized antenna according to the present invention are described. FIGS. 5A to 5C are graphs illustrating frequency characteristics of the power feed circuit for a circularly polarized antenna according to the present invention. FIG. 5A represents VSWR characteristics (S11, S22, S33) in dB vs, frequency in GHz, FIG. 5B represents a phase difference between paths (S21; S31) in deg vs, frequency in GHz, and FIG. 5C represents an amplitude ratio between paths (S21; S31) in dB vs, frequency in GHz. Specifically, the graphs of FIGS. 5A to 5C are each a simulation graph obtained when employing the circuit configuration as illustrated in FIG. 2, in which two phase shift circuits constituted respectively by a phase lag circuit and a phase lead circuit are connected to two respective paths and in which a phase difference between the two paths is 90°. As a comparative example, FIGS. 6A to 6C illustrate various frequency characteristics of a conventional circuit configuration. FIG. 6A represents VSWR characteristics (S11, S22, S33) in dB vs, frequency in GHz, FIG. 6B represents a phase difference between paths (S21; S31) in deg vs, frequency in GHz, and FIG. 6C represents an amplitude ratio between paths (S21; S31) in dB vs, frequency in GHz. The graphs of FIGS. 6A to 6C are each a simulation graph obtained when employing a conventional circuit configuration as disclosed in Patent Document 1, in which a phase shift circuit using a 90° phase lag circuit is interposed only on one of two paths connecting the synthesizing-distributing unit and the two feed points and in which a phase difference between the two paths is 90°.

As can be seen from these graphs, in the conventional circuit configuration, a −90° shift is made using a single circuit, so that, as the frequency deviates from the center frequency (1387 MHz) in the GNSS full band, the phase difference becomes larger and significantly deviates from 90°, which reveals that it is difficult to support the GNSS full band with a single phase shift circuit.

On the other hand, in the power feed circuit for a circularly polarized antenna according to the present invention, although the phases of the phase shift circuits individually deviate from +45° as the frequency deviates from the center frequency (1387 MHz) in the GNSS full band, they deviate in the same fashion, with the result that the phase difference between the phase shift circuits can always be maintained at 90°. As described above, the power feed circuit for a circularly polarized antenna according to the present invention can achieve a stable phase difference between the two paths connected to the two feed points over a wide band. Further, the amplitude ratio is small over a wide range. The power feed circuit for a circularly polarized antenna according to the present invention can support the GNSS full band.

Figure 7:
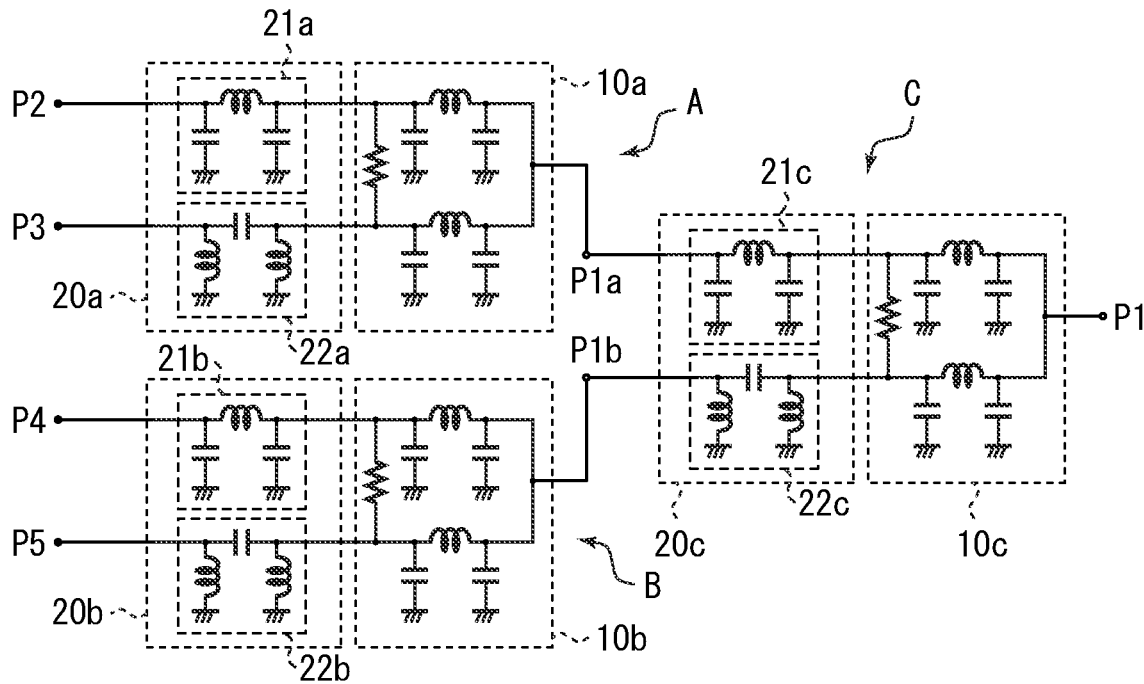
FIG. 7 is a specific circuit diagram for explaining an example where the power feed circuit for a circularly polarized antenna according to the present invention is configured to feed power to four feed points.

The following describes a case where the power feed circuit for a circularly polarized antenna according to the present invention is applied to a four-point-feed circularly polarized antenna. FIG. 7 is a specific circuit diagram for explaining an example where the power feed circuit for a circularly polarized antenna according to the present invention is configured to feed power to four feed points. In the drawing, the same reference numerals as those in FIG. 2 denote the same parts. On the side of the four feed points, there are provided two power feed circuits each having the same configuration as that in the illustrated example described above, and signals whose phase difference is 180° are input respectively to input terminals (P1a and P1b) of the two power feed circuits.

In the example illustrated in FIG. 7, there are provided three power feed circuits in total, each power feed circuit having the same configuration as that in the illustrated example described above. That is, the four-point-feed power feed circuit for a circularly polarized antenna includes a first power feed circuit A and a second power feed circuit B each of which has the same configuration as the power feed circuit in the power feed circuit for a circularly polarized antenna illustrated in FIG. 2, and a third power feed circuit C configured as a 180° synthesizing-distributing unit.

The first power feed circuit A includes a first synthesizing-distributing unit 10a and a first phase shift unit 20a. The first synthesizing-distributing unit 10a distributes signals from a first input terminal P1a to two paths with the same phase and same amplitude. The first phase shift unit 20a has two first phase shift circuits 21a and 22a each constituted by a lumped constant circuit. The two first phase shift circuits 21a and 22a are connected respectively between the two paths distributed by the first synthesizing-distributing unit 10a and two feed points P2, P3 in the four feed points P2, P3, P4, and P5. The first phase shift circuits 21a and 22a output signals whose phase difference is 90° to the feed points P2 and P3, respectively. For example, the first phase shift circuit 21a may shift the phase by −45°, and the first phase shift circuit 22a may shift the phase by +45°.

The second power feed circuit B includes a second synthesizing-distributing unit 10b and a second phase shift unit 20b. The second synthesizing-distributing unit 10b distributes signals from a second input terminal P1b to the two paths with the same phase and same amplitude. The second phase shift unit 20b has two second phase shift circuits 21b and 22b each constituted by a lumped constant circuit. The two second phase shift circuits 21b and 22b are connected respectively between the two paths distributed by the second synthesizing-distributing unit 10b and two feed points P4, P5 in the four feed points P2, P3, P4, and P5. The second phase shift circuits 21b and 22b output signals whose phase difference is 90° to the feed points P4 and P5, respectively. For example, the second phase shift circuit 21b may shift the phase by −45°, and the second phase shift circuit 22b may shift the phase by +45°.

The third power feed circuit C configured as a 180° synthesizing-distributing unit has basically the same configuration as those of the first power feed circuit A and the second power feed circuit B but is configured to distribute input signals to the two paths such that a phase difference between the signals is 180°. The third power feed circuit C includes a third synthesizing-distributing unit 10c and a third phase shift unit 20c. The third synthesizing-distributing unit 10c distributes input signals from the port P1 to the two paths with the same phase and same amplitude. The third phase shift unit 20c has two third phase shift circuits 21c and 22c each constituted by a lumped constant circuit. The two third phase shift circuits 21c and 22c output signals whose phase difference is 180° to the first input terminal P1a and the second input terminal P1b, respectively. For example, the third phase shift circuit 21c may shift the phase by −90°, and the third phase shift circuit 22c may shift the phase by +90°.

With the above configuration, input signals from the port P1 are distributed to the two paths with the same phase and same amplitude by the third synthesizing-distributing unit 10c and input respectively to the third phase shift circuits 21c and 22c. Then, signals whose phase difference between the two paths is 180° are input to the first input terminal P1a of the first power feed circuit A and the second input terminal P1b of the second power feed circuit B. In the first power feed circuit A, the input signals are distributed with the same phase and same amplitude by the first synthesizing-distributing unit 10a, and signals whose phase difference is 90° are input respectively to the feed points P2 and P3 through the respective first phase shift circuits 21a and 22a. Similarly, in the second power feed circuit B, the input signals are distributed with the same phase and same amplitude by the second synthesizing-distributing unit 10b, and signals whose phase difference is 90° are input respectively to the feed points P4 and P5 through the respective second phase shift circuits 21b and 22b. That is, a signal with a phase of −tm 135° is input to the feed point P2, a signal with a phase of −45° is input to the feed point P3, a signal with a phase of +45° is input to the feed point P4, and a signal with a phase of +135° is input to the feed point P5.

Figure 8:
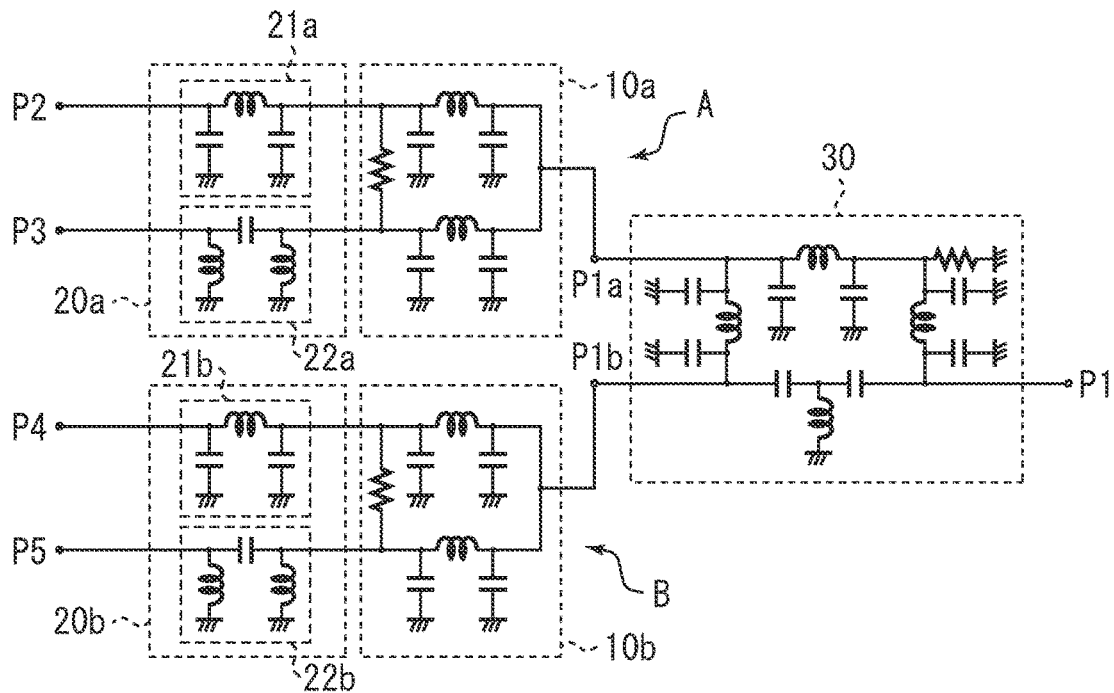
FIG. 8 is a specific circuit diagram for explaining another example where the power feed circuit for a circularly polarized antenna according to the present invention is configured to feed power to four feed points.

The following further describes another example where the power feed circuit for a circularly polarized antenna according to the present invention is applied to a four-point-feed circularly polarized antenna. FIG. 8 is a specific circuit diagram for explaining another example where the power feed circuit for a circularly polarized antenna according to the present invention is configured to feed power to four feed points. In the drawing, the same reference numerals as those in FIG. 7 denote the same parts. As illustrated, this example uses two power feed circuits each having the same configuration as that in the example described above. That is, the four-point-feed power feed circuit for a circularly polarized antenna includes a first power feed circuit A and a second power feed circuit B each of which has the same configuration as the power feed circuit in the power feed circuit for a circularly polarized antenna illustrated in FIG. 2. Unlike the example illustrated in FIG. 7, as the 180° synthesizing-distributing unit that outputs signals whose phase difference is 180° to the first input terminal P1a and the second input terminal P1b, a 180° rat-race circuit 30 is used. The 180° rat-race circuit 30 distributes input signals from the port P1 to the two paths such that a phase difference between the signals is 180°. As illustrated, the two paths distributed by the 180° rat-race circuit 30 are connected respectively to the first input terminal P1a and the second input terminal P1b. It follows that signals whose phase difference is 180° are input to the first input terminal P1a and the second input terminal P1b. The configurations of the first power feed circuit A and the second power feed circuit B are the same as those in the example illustrated in FIG. 7, so descriptions thereof will be omitted.

In the illustrated example, the 180° rat-race circuit 30 is formed by combining three π-type CLC filter circuits and one T-type CLC filter circuit, but not limited to this, and may be formed by combining three π-type LCL filter circuit and one π-type CLC filter circuit.

Figure 9:
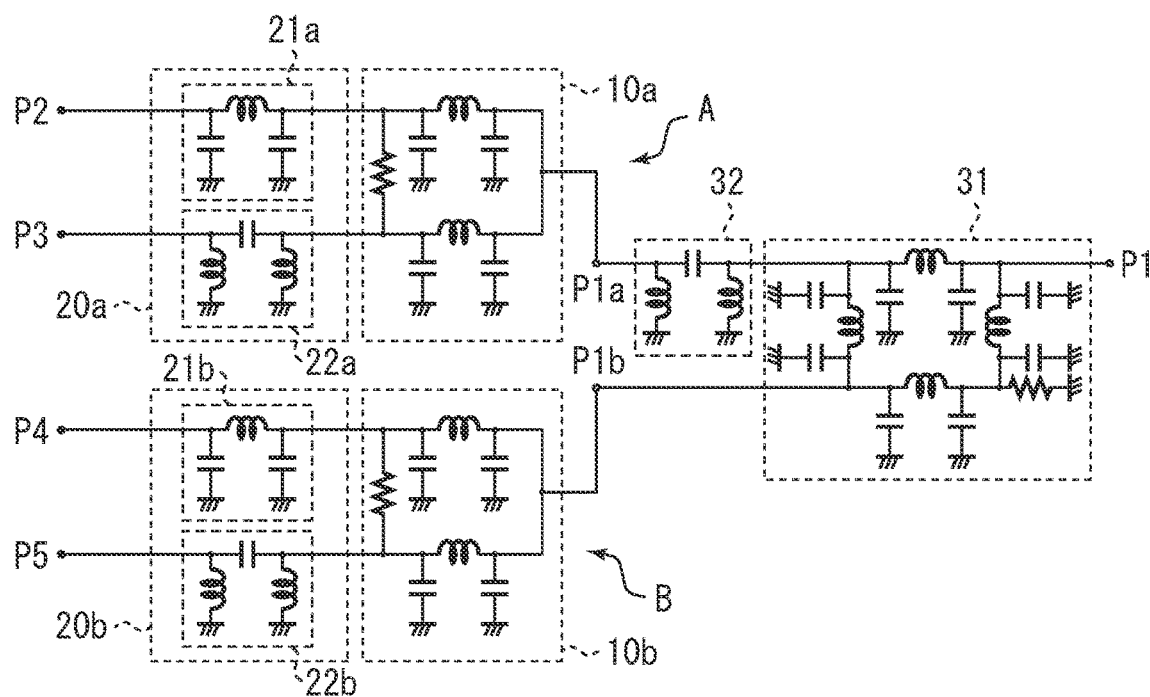
FIG. 9 is a specific circuit diagram for explaining still another example where the power feed circuit for a circularly polarized antenna according to the present invention is configured to feed power to four feed points.

Further, the 180° synthesizing-distributing unit may be formed by combining a 90° hybrid circuit and a 90° phase shift circuit. FIG. 9 is a specific circuit diagram for explaining still another example where the power feed circuit for a circularly polarized antenna according to the present invention is configured to feed power to four feed points. In the drawing, the same reference numerals as those in FIG. 8 denote the same parts. As illustrated, this example uses, as the 180° synthesizing-distributing unit, a 90° hybrid circuit 31 and a 90° phase shift circuit 32 to output signals whose phase difference is 180° to the first input terminal P1a and the second input terminal P1b. As illustrated, the two paths distributed by the 90° hybrid circuit 31 distribute input signals from the port P1 to the two paths such that a phase difference between the signals is 90°. One of the two paths distributed by the 90° hybrid circuit 31 is connected to the 90° phase shift circuit 32. The path from the 90° phase shift circuit 32 is connected to the first input terminal P1a. The other of the two paths distributed by the 90° hybrid circuit 31 is directly connected to the second input terminal P1b. It follows that signals whose phase difference is 180° are input to the first input terminal P1a and the second input terminal P1b. The configurations of the first power feed circuit A and the second power feed circuit B are the same as those in the example illustrated in FIG. 7, so descriptions thereof will be omitted.

As in the illustrated examples described above, the four-point-feed power feed circuits for a circularly polarized antenna according to the present invention illustrated in FIGS. 7 to 9 may be constituted by the lumped constant circuit or distributed constant circuit.

As described above, the power feed circuit for a circularly polarized antenna according to the present invention can be applied not only to two-point-feed circularly polarized antennas but also to four-point-feed circularly polarized antennas.

The power feed circuit for a circularly polarized antenna according to the present invention is not limited to the illustrated examples described above but may be variously modified within the scope of the present invention.

The invention claimed is:
1. A power feed circuit for feeding power to a circularly polarized antenna, the power feed circuit comprising:
   a synthesizing-distributing unit that distributes input signals to two paths with the same phase and same amplitude; and
   a phase shift unit that has two phase shift circuits connected respectively between the two paths distributed by the synthesizing-distributing unit and two feed points of the circularly polarized antenna and that outputs signals whose phase difference is 90° to the two feed points of the circularly polarized antenna, wherein
   the phase shift unit is constituted by one of the phase shift circuits of the phase shift unit shifting the phase of a signal by −45°, and the other of the phase shift circuits of the phase shift unit shifting the phase of a signal by +45°.
2. The power feed circuit for feeding power to a circularly polarized antenna according to claim 1, wherein
   the phase shift unit is constituted by one of the phase shift circuits of the phase shift unit being a phase lag circuit, and the other of the phase shift circuits of the phase shift unit being a phase lead circuit.

3. The power feed circuit for feeding power to a circularly polarized antenna according to claim 1, wherein
the synthesizing-distributing unit is constituted by a lumped constant circuit or a Wilkinson circuit provided by a distributed constant circuit.

4. The power feed circuit for feeding power to a circularly polarized antenna according to claim 1, wherein
the phase shift unit is constituted by one of the phase shift circuits of the phase shift unit having a low-pass filter circuit configuration, and the other of the phase shift circuits of the phase shift unit having a high-pass filter circuit configuration.

5. The power feed circuit for feeding power to a circularly polarized antenna according to claim 1, wherein
one of the phase shift circuits of the phase shift unit being an L-type CL filter circuit, a π-type CLC filter circuit, a T-type LCL filter circuit, or a multistage circuit thereof, and the other of the phase shift circuits of the phase shift unit being a L-type LC filter circuit, a π-type LCL filter circuit, a T-type CLC filter circuit, or a multistage circuit thereof.

6. The power feed circuit for feeding power to a circularly polarized antenna according to claim 1, wherein
the phase shift unit is constituted by a lumped constant circuit.

7. A power feed circuit for feeding power to a four-point-feed circularly polarized antenna, the power feed circuit comprising:
a first power feed circuit including a first synthesizing-distributing unit that distributes signals from a first input terminal to two paths, which are separate from each other, with the same phase and same amplitude, and a first phase shift unit that has two first phase shift circuits connected respectively between the two paths distributed by the first synthesizing-distributing unit and two feed points of the four feed points of the circularly polarized antenna and outputs signals whose phase difference is 90° to the two feed points of four feed points of the circularly polarized antenna;
a second power feed circuit including a second synthesizing-distributing unit that distributes signals from a second input terminal to two paths, which are separate from each other, with the same phase and same amplitude, and a second phase shift unit that has two second phase shift circuits connected respectively between the two paths distributed by the second synthesizing-distributing unit and the remaining two feed points of the four feed points of the circularly polarized antenna and outputs signals whose phase difference is 90° to the remaining two feed points of the four feed points of the circularly polarized antenna; and
a 180° synthesizing-distributing unit that distributes input signals to two paths, which are separate from each other, such that a phase difference between the signals is 180°, the two paths distributed by the 180° synthesizing-distributing unit being connected respectively to the first input terminal and the second input terminal and outputting the signals whose phase difference is 180° to the first input terminal and the second input terminal.

8. The power feed circuit for feeding power to a four-point-feed circularly polarized antenna according to claim 7, wherein
the 180° synthesizing-distributing unit is constituted by:
a 90° hybrid circuit that distributes input signals to two paths such that a phase difference between the signals is 90°; and
a 90° phase shift circuit connected to one of the two paths distributed by the 90° hybrid circuit, wherein
a path from the 90° phase shift circuit is connected to the first input terminal, and the other of the two paths distributed by the 90° hybrid circuit is connected to the second input terminal.

9. The power feed circuit for feeding power to a four-point-feed circularly polarized antenna according to claim 7, wherein
the 180° synthesizing-distributing unit includes:
a third synthesizing-distributing unit that distributes input signals to two paths, which are separate from each other, with the same phase and same amplitude; and
a third phase shift unit that has two third phase shift circuits connected respectively between the two paths distributed by the third synthesizing-distributing unit and the first input terminal and the second input terminal.

10. The power feed circuit for feeding power to a four-point-feed circularly polarized antenna according to claim 7, wherein
the 180° synthesizing-distributing unit is constituted by a 180° rat-race circuit.

* * * * *